United States Patent
Miller et al.

(10) Patent No.: US 10,900,808 B2
(45) Date of Patent: Jan. 26, 2021

(54) DYNAMIC TRANSMITTER POWER CONTROL FOR MAGNETIC TRACKER

(71) Applicant: MICROSOFT TECHNOLOGY LICENSING, LLC, Redmond, WA (US)

(72) Inventors: Quentin Simon Charles Miller, Sammamish, WA (US); Scott Francis Fullam, Palo Alto, CA (US); Lev Cherkashin, Redmond, WA (US); Steven James Velat, Kirkland, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 16/572,196

(22) Filed: Sep. 16, 2019

(65) Prior Publication Data

US 2020/0011704 A1    Jan. 9, 2020

Related U.S. Application Data

(63) Continuation of application No. 15/586,459, filed on May 4, 2017, now Pat. No. 10,451,439.

(60) Provisional application No. 62/438,314, filed on Dec. 22, 2016.

(51) Int. Cl.
*G01D 5/12* (2006.01)
*G01R 33/02* (2006.01)
*G01B 7/14* (2006.01)

(52) U.S. Cl.
CPC .............. *G01D 5/12* (2013.01); *G01B 7/14* (2013.01); *G01R 33/02* (2013.01)

(58) Field of Classification Search
CPC ...................................................... G01D 5/12
See application file for complete search history.

(56) References Cited

U.S. PATENT DOCUMENTS

| | | | |
|---|---|---|---|
| 9,741,169 B1 * | 8/2017 | Holz | G06F 3/017 |
| 2013/0169682 A1 * | 7/2013 | Novak | G02B 27/0093 |
| | | | 345/633 |
| 2013/0174213 A1 * | 7/2013 | Liu | G06T 19/006 |
| | | | 726/1 |
| 2014/0240351 A1 * | 8/2014 | Scavezze | G06F 3/0346 |
| | | | 345/633 |

(Continued)

*Primary Examiner* — Raymond L Nimox
(74) *Attorney, Agent, or Firm* — Workman Nydegger (57) ABSTRACT

A system determines the transmission strength of the magnetic field signal. The magnetic field signal is transmitted from a first magnetic-sensor device to a second magnetic-sensor device. The system then determines a first projected distance between the first magnetic-sensor device and the second magnetic-sensor device. Based at least in part on the first projected distance, the system calculates an adjusted transmission strength for the magnetic field signal. The system then causes the first magnetic-sensor device to transmit an adjusted magnetic field signal. The adjusted magnetic field signal comprises the adjusted transmission strength. The system receives, from the second magnetic-field device, the adjusted magnetic field signal. Based at least in part upon the received adjusted magnetic field signal, the system, computes a first pose of the first magnetic-sensor device in relation to the second magnetic-sensor device.

20 Claims, 6 Drawing Sheets

(56) References Cited

U.S. PATENT DOCUMENTS

| | | | |
|---|---|---|---|
| 2015/0097719 A1* | 4/2015 | Balachandreswaran ..................... A63F 13/5255 342/147 | |
| 2016/0124502 A1* | 5/2016 | Sawyer ................ G02B 27/017 345/633 | |
| 2017/0045941 A1* | 2/2017 | Tokubo ................... A63F 13/53 | |
| 2017/0287219 A1* | 10/2017 | Poulos ............... G02B 27/0172 | |
| 2017/0351094 A1* | 12/2017 | Poulos ................... G01B 7/003 | |
| 2017/0352184 A1* | 12/2017 | Poulos ............... G02B 27/0172 | |
| 2017/0357332 A1* | 12/2017 | Balan ................ G02B 27/0093 | |

\* cited by examiner

Handheld Controller 220

Head Mounted Display 210

DYNAMIC TRANSMITTER POWER CONTROL FOR MAGNETIC TRACKER

CROSS-REFERENCE TO RELATED APPLICATIONS

This application is a continuation of U.S. application Ser. No. 15/586,459, entitled "DYNAMIC TRANSMITTER POWER CONTROL FOR MAGNETIC TRACKER", filed on May 4, 2017, which claims priority to and the benefit of U.S. Application Ser. No. 62/438,314 entitled "DYNAMIC TRANSMITTER POWER CONTROL FOR MAGNETIC TRACKER", filed on Dec. 22, 2016, both of which are incorporated herein by reference in their entirety.

BACKGROUND

Computers and computing systems have impacted nearly every aspect of modern living. Computers are generally involved in work, recreation, healthcare, transportation, entertainment, household management, etc.

Mixed-reality computer systems, including virtual-reality systems and augmented-reality systems, have recently received significant interest for their ability to create immersive experiences for users. Conventional augmented-reality systems create an augmented reality scenario by visually presenting virtual objects in the real world. In contrast, conventional virtual-reality systems create a more immersive experience such that a user's entire view is obstructed by a virtual world. As used herein, mixed-reality, augmented-reality, and virtual-reality systems are described and referenced interchangeably. In general, however, "mixed-reality" will be used to broadly describe the various technologies. Unless specifically stated or unless specifically required, as understood by one of skill in the art, the descriptions herein apply equally to any type of mixed-reality system, including augmented-reality systems, virtual-reality systems, and/or any other similar system capable of displaying virtual objects to a user.

Continued advances in hardware capabilities and rendering technologies have greatly increased the realism of virtual objects and scenes displayed to a user within a mixed-reality environment. For example, in mixed-reality environments, virtual objects can be placed within the real world in such a way as to give the impression that the virtual object is part of the real world. As a user moves around within the real world, the mixed-reality environment automatically updates so that the user is provided with the proper perspective and view of the virtual object; this mixed-reality environment is referred to as a scene.

Immersing a user into a mixed-reality environment creates many challenges and difficulties that extend beyond the mere presentation of a scenario to a user. For example, there is significant interest in the field regarding technologies that allow a user to interact with virtual objects in a mixed-reality scenario. Various systems and methods are used to provide this interactive ability to the users.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed embodiments include systems, methods, and computer-readable media for dynamically modifying a transmission strength of a magnetic field signal. An exemplary system determines the transmission strength of the magnetic field signal. The magnetic field signal being transmitted from a first magnetic-sensor device to a second magnetic-sensor device. The system then determines a first projected distance between the first magnetic-sensor device and the second magnetic-sensor device. Based at least in part on the first projected distance, the system calculates an adjusted transmission strength for the magnetic field signal. The system then causes the first magnetic-sensor device to transmit an adjusted magnetic field signal. The adjusted magnetic field signal comprises the adjusted transmission strength. The system receives, from the second magnetic-field device, the adjusted magnetic field signal. Based at least in part upon the received adjusted magnetic field signal, the system computes a first pose of the first magnetic-sensor device in relation to the second magnetic-sensor device.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows, and in part will be obvious from the description, or may be learned by the practice of the teachings contained herein. Features and advantages of the invention may be realized and obtained by means of the instruments and combinations particularly pointed out in the appended claims. These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION

Embodiments disclosed herein include systems, computer-readable media, and methods for dynamically modifying a transmission strength of a magnetic field signal. In at least one disclosed embodiment, a mixed-reality system adjusts a transmission strength of a magnetic field signal based upon a distance between the magnetic field transmitter and the magnetic field signal. Various additional or alternative embodiments account for additional variables when adjusting the transmission strength of the magnetic field signal. In at least one embodiment, the ability to dynamically adjust the transmission strength of the magnetic field signal allows mixed-reality systems to optimize battery life while minimizing bandwidth congestion for other magnetic field sensors.

Disclosed embodiments overcome many deficiencies prevalent throughout the conventional technology. For example, disclosed embodiments provide accurate pose data while at the same time optimizing battery life. As mixed-reality systems become increasingly mobile, there will be growing pressure to reduce the weight and size of the mixed-reality system. In many systems, batteries are a major addition to the overall bulk and weight of the mixed-reality system. As battery size shrinks to accommodate smaller, lighter systems, there will be a growing need to provide methods and systems that extend the battery life of components within the mixed-reality system.

The following discussion may refer to a number of methods and method acts that may be performed. Although the method acts may be discussed in a certain order or illustrated in a flow chart as occurring in a particular order, no particular ordering is required unless specifically stated, or required, because an act is dependent on another act being completed prior to the act being performed.

Figure 1:
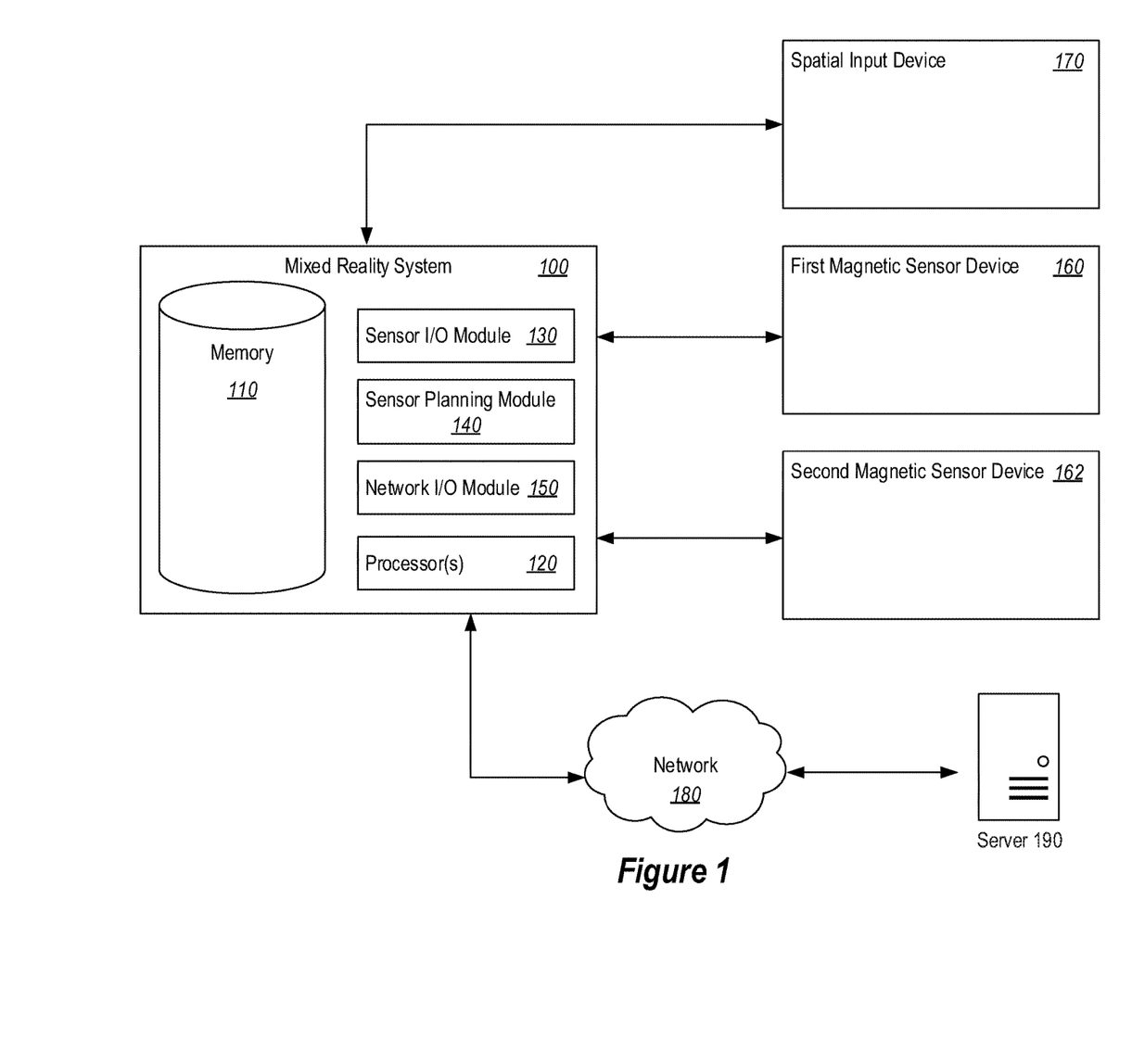
FIG. 1 illustrates a schematic diagram of an embodiment of a mixed-reality system and associated devices.

Initially, FIG. 1 illustrates a schematic diagram of an embodiment of a mixed-reality system 100 that is in communication with a first magnetic sensor device 160, a second magnetic sensor device 162, a spatial input device 170, a network 180, and a server 190. As used herein, a spatial input device comprises any device that uses spatial positioning and/or motion of a user to gather input. As such, the first magnetic sensor device 160 and the second magnetic sensor device 162 are examples of spatial input devices. Other examples of spatial input devices include, but are not limited to, a camera, an inertial measurement unit ("IMU"), a LIDAR, a GPS unit, accelerometers, gyroscopes, sonars, depth sensors, and other devices capable of capturing position and/or motion data from a user. In many cases herein, a particular type of spatial input device will be recited, but it should be understood that a more general spatial input device could be interchangeably used. One will appreciate that the various modules, components, and devices shown in FIG. 1 and throughout this application are provided for the sake of example and explanation. In additional or alternate embodiments, the mixed-reality system 100 may include a different combination of modules, components, and devices.

As used herein, "magnetic-sensor devices" and "on-body devices" are used interchangeably. More specifically, on-body devices are used as examples of magnetic sensor devices that can be configured to perform various embodiments disclosed herein. One will appreciate that the scope of embodiments disclosed herein is not limited to particular forms or devices, but can, instead, be implemented in a variety of different embodiments that extend beyond on-body devices. Additionally, as used herein, a secondary communication channel comprises a communication channel other than the measurement of magnetic field to determine pose. For example, the secondary communication channel may comprise BLUETOOTH, WIFI, or any other communication standard that allows for the two-way transfer of data. Additionally, as used herein a magnetic sensor device comprises a device that is capable of emitting and/or receiving magnetic field signals.

The depicted mixed-reality system 100 includes one or more processor(s) 120 and memory 110. The one or more processor(s) 120 and memory 110 may be representative of hardware components and/or software components. The mixed-reality system 100 also includes a sensor I/O module 130, a pose computing module 140, and a network I/O module 150. In at least one embodiment, the sensor I/O module 130 communicates with one or more spatial input devices that provide sensor information useful for generating a mixed-reality environment. The one or more spatial input devices comprise spatial input device 170, first magnetic sensor device 160, and second magnetic sensor device 162. The first magnetic sensor device 160 and the second magnetic sensor device 162 are configured to track a pose of a user within a mixed-reality environment. The sensor I/O module 130 may also communicate with one or more cameras, depth sensors, LIDARs, accelerometers, gyroscopes, sonars, and any other sensors useful within a mixed-reality environment.

The first magnetic sensor device 160 may be embedded within a mixed-reality headset and the second magnetic sensor device 162 may be embedded within a handheld controller. As the user moves the handheld controller around within the mixed-reality environment, the mixed-reality system 100 causes the first magnetic sensor device 160 to transmit a known magnetic field signal. The mixed-reality system 100 also causes the second magnetic sensor device 162, within the handheld controller, to measure variations in the magnetic field signal as the handheld controller is moved between different positions. The second magnetic sensor device 162 communicates these measured variations to the sensor I/O module 130. The one or more processor(s) 120 are then able to determine the relative measured variations. One will appreciate that in at least one embodiment the second magnetic sensor device 162 generates magnetic field signals that the first magnetic sensor device 160 receives.

In various additional or alternative embodiments, the mixed-reality system 100 also utilizes spatial input device 170 to track the relative pose of the user within the mixed-reality environment. For example, the mixed-reality system 100 may utilize a spatial input device 170 in the form of a camera to track the pose of the handheld controller, and in turn the second magnetic sensor device 162. For example, whenever the handheld controller is within the field-of-view of the camera, the camera may track specific points (e.g., reflectors) that are placed on the handheld controller. Similarly, the handheld controller may comprise a spatial input device 170 in the form of an IMU that is able to also provide motion and tracking data relating to the handheld controller. The pose computing module 140 is capable of choosing to rely upon a particular sensor for computing pose or to rely upon a combination of multiple sensors to compute pose. As such, in at least one embodiment, the pose computing module 140 can gather pose data from the handheld controller using the integrated second magnetic sensor device 162, an integrated IMU, an external camera, and/or any number of other different spatial input devices.

In at least one embodiment, the network I/O module 150 communicates with the server 190 through a network 180. The network I/O module 150 receives data that is associated with the particular mixed-reality environment that the user is within and, in some cases, receives data related to other mixed-reality systems that are in the vicinity of mixed-reality system 100. For example, the mixed-reality system 100 may receive an indication that another mixed-reality system is being used in the same room. The indication may also comprise information about the current state of the other mixed-reality system's sensors and communication states. Using this information, the mixed-reality system 100 can adjust the output of various spatial input devices to optimize the performance of the mixed-reality system.

Figure 2:
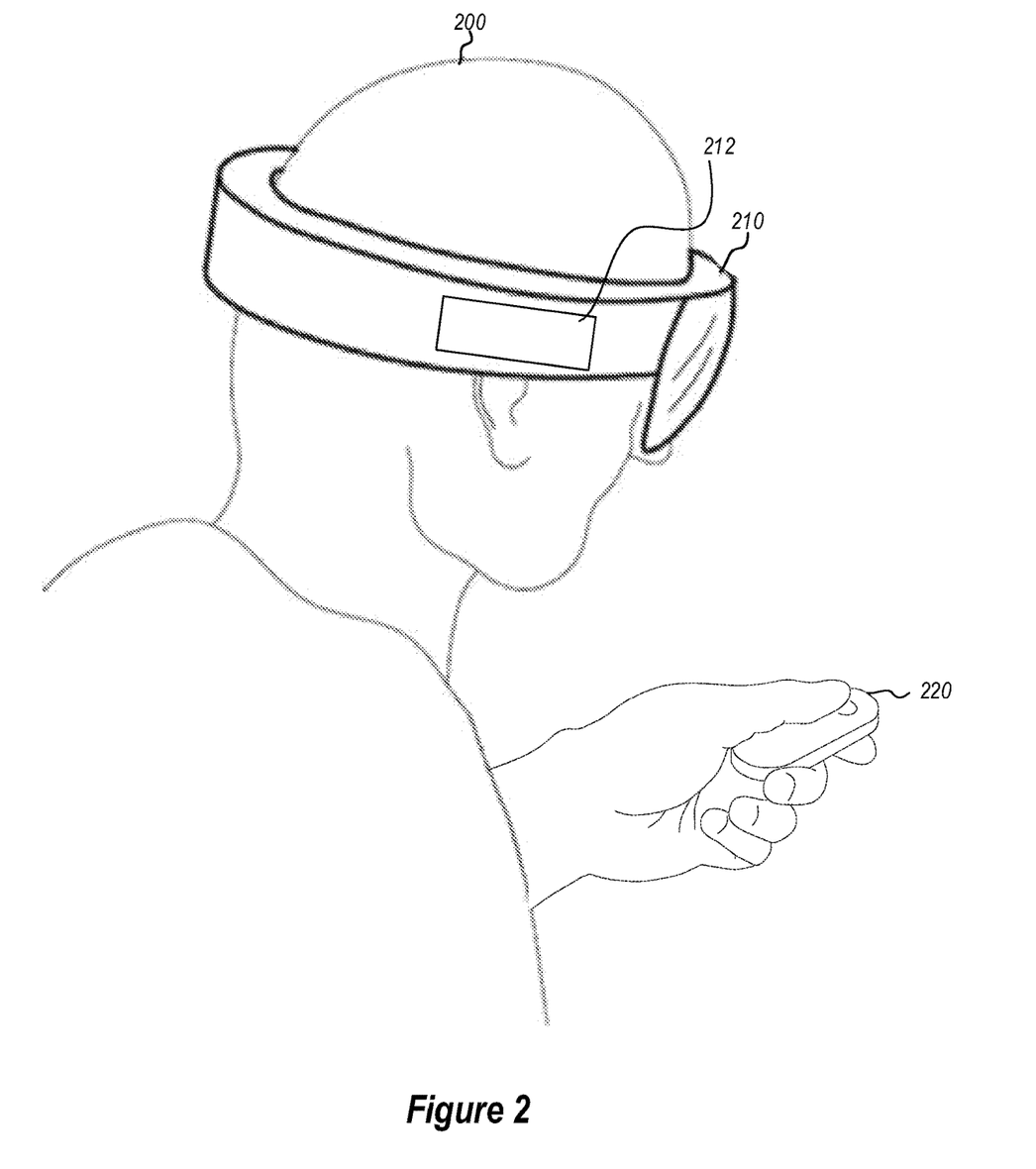
FIG. 2 illustrates an embodiment of mixed-reality devices being used by a user.

FIG. 2 illustrates an embodiment of mixed-reality devices being used by a user 200. The mixed-reality system depicted in FIG. 2 includes a head-mounted display ("HMD") 210 positioned on a user 200. In the depicted embodiment, the HMD 210 is associated with a mixed-realty system 100 like that described in FIG. 1. Additionally, the HMD 210 includes at least one sensor unit 212 that gathers sensor information relating to the mixed-reality environment. One of skill in the art will recognize that the depicted system can analogously be used within mixed-reality, augmented reality, virtual reality, or any other similar endeavor.

FIG. 2 also depicts a handheld controller 220. The handheld controller 220 comprises one or more integrated spatial input devices. Although FIG. 2 illustrates only a single handheld controller 220, embodiments of the present invention are not limited solely to those devices depicted in FIG. 2. For instance, embodiments of the present invention can be configured to simultaneously utilize many on-body devices. Even further, the on-body devices need not merely be handheld or head-mounted. For instance, embodiments of the present invention can be configured to utilize any type of on-body device (e.g., a device mounted on a user's foot, a device mounted on a user's torso, etc.). Additionally, embodiments disclosed herein can also be practiced outside of mixed-reality environments. For example, a user may control a conventional computer using systems, methods, and apparatuses disclosed herein.

The handheld controller 220 may include one or more IMUs. By manipulating the handheld controller 220, the user 200 can interact with the mixed-reality environment and provide user input to the HMD 210. This input can include, for example, controlling and moving virtual objects included within the mixed-reality scenario. A wide variety of user input can be provided. Accordingly, FIG. 2 presents a wearable mixed-reality system 100 that utilizes handheld and head-mounted devices. Together, these devices (i.e. the HMD 210 and the handheld controller 220) enable a user to precisely and rapidly control the mixed-reality computing system.

On-body devices, such as the handheld controller 220 depicted in FIG. 2, comprise magnetic sensor devices that use a magnetic field signal to allow measurement of the pose of the handheld controller 220 with respect to a sensor unit 212 in the HMD 210. In at least one embodiment, the magnetic field signal, the HMD 210, and the handheld controller 220 work in unison to determine how the handheld controller 220 is oriented/situated in relation to the HMD 210 (i.e. its "pose"). Determining the handheld device's pose with respect to the HMD 210 enhances the mixed-reality scenario that is presented to the user 200.

For instance, suppose the mixed-reality computing system 100 presents a scenario in which a user 200 has a virtual object (e.g., a gun, laser, watch, etc.) attached to his/her arm. This scenario may be designed to allow the user 200 to use the virtual object to advance through stages of the scenario (e.g., perhaps the user is to use the gun to fight villains). As a result, the user 200 will move and interact with the images depicted in the scenario. The virtual object should move in unison with the user's movements. Indeed, to provide an enhanced experience, the virtual object should follow the user's specific arm movements. Accordingly, accurate pose positioning of the virtual object (which is accomplished through the communications between the HMD 210 and the handheld controller 220) will better enable the user 200 to advance through the various stages of the scenario.

Figure 3:
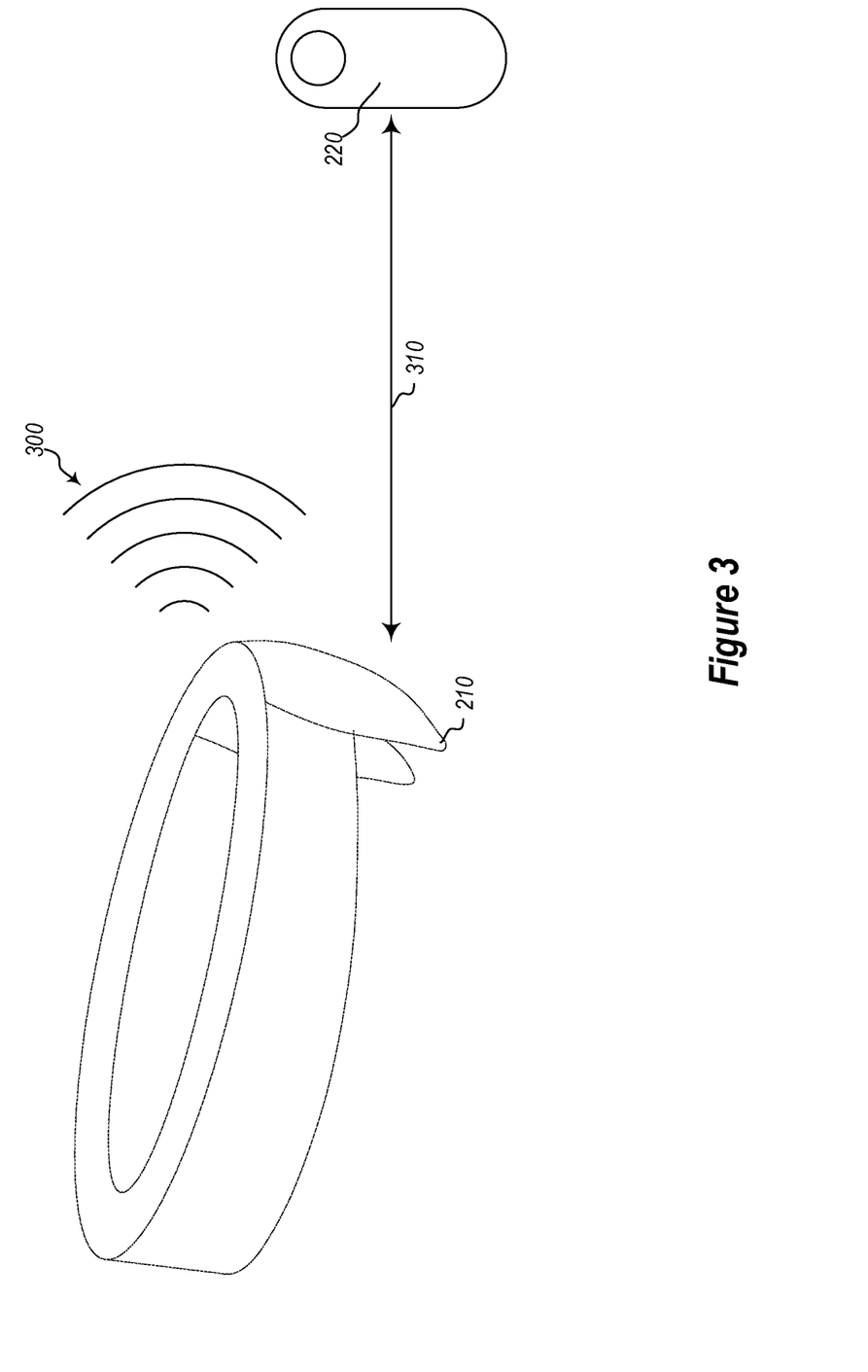
FIG. 3 illustrates a schematic diagram of an embodiment of mixed-reality devices communicating with each other.

FIG. 3 provides a high-level overview of how the mixed-reality computing system determines an on-body device's pose. For instance, FIG. 3 illustrates a schematic diagram of an embodiment of spatial input devices communicating with each other. In the depicted embodiment, the mixed-reality system 100 operates by having at least one of the spatial input devices (e.g., the HMD 210) transmit a magnetic field signal 300. While the HMD 210 is transmitting the magnetic field signal 300, a different spatial input device (e.g., the handheld controller 220) will measure the received magnetic field signal. The pose of the on-body device (e.g., the handheld controller 220) can then be computed using the near field fall off relationship and the measured characteristics of the magnetic field signal 300.

FIG. 3 also illustrates that a secondary communication channel 310 can be maintained between the two devices. The secondary communication channel 310 is used to communicate data between the two devices and to synchronize other communications between the various devices of the mixed-reality system 100. The secondary communication channel 310 may be different than the channels used to transmit the magnetic field signal. For instance, the secondary communication channel 310 can be in the form of a BLUETOOTH™ channel.

Figure 4:
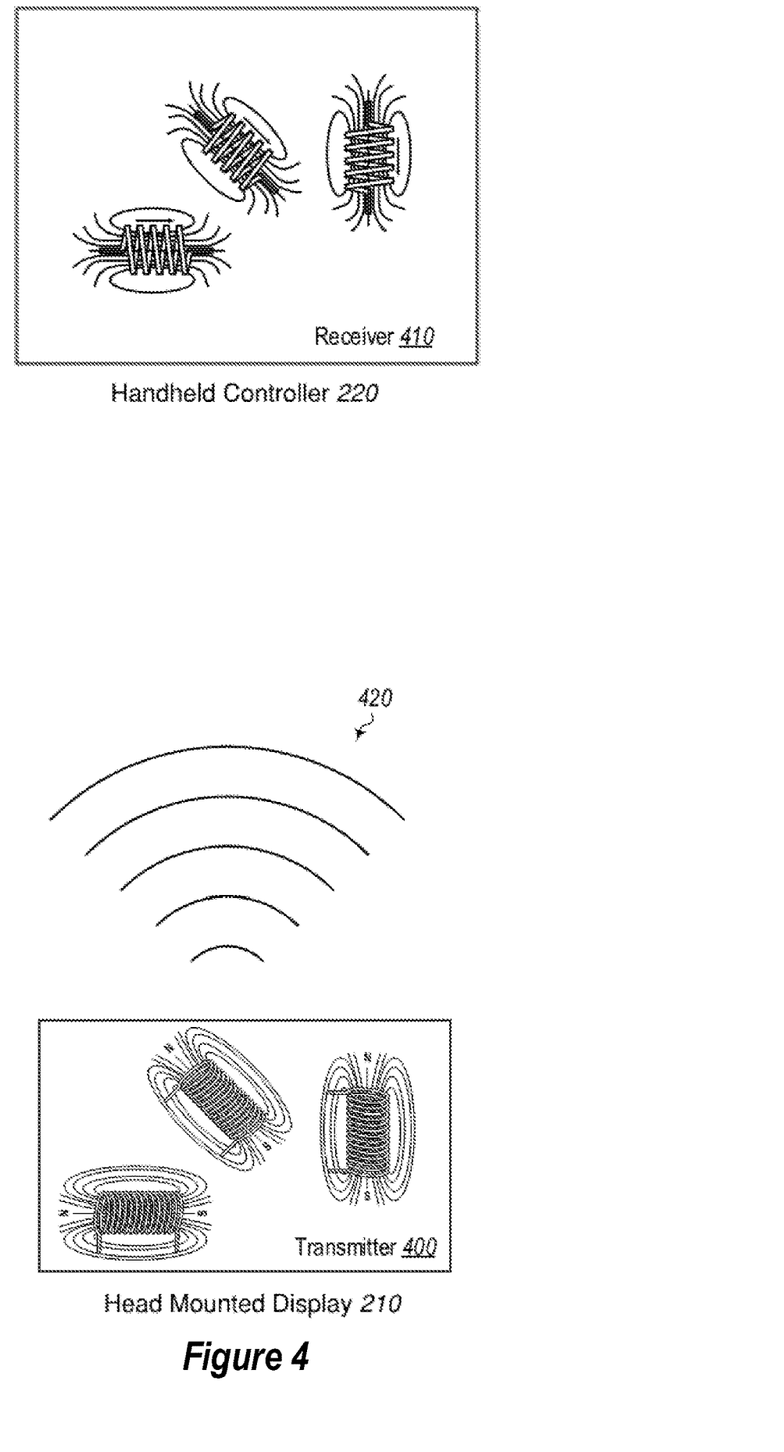
FIG. 4 illustrates a schematic diagram of another embodiment of mixed-reality devices communicating with each other.

FIG. 4 presents an alternative depiction of the spatial input devices of a mixed-reality system 100. For instance, FIG. 4 illustrates a schematic diagram of another embodiment of spatial input devices communicating with each other. In particular, a transmitter 400 is depicted emitting a magnetic field signal 420 to a receiver 410. The transmitter 400 may be embedded within an HMD 210. The receiver 410 may be embedded within a handheld controller 220. In at least one additional or alternative embodiment, the HMD 210 and/or the handheld controller 220 comprises magnetic transceivers that are capable of both emitting and receiving magnetic field signals.

Although not shown in the figures, the HMD 210 (and even the other on-body devices) may include other spatial input devices as well. To illustrate, the HMD 210 can include one or more cameras (e.g., color and/or black and white), depth sensors, infrared sensors, accelerometers, gyroscopes, magnetometers, etc. These other spatial input devices can be used for a variety of reasons. By way of example and not limitation, the spatial input devices of the mixed-reality system 100 can be used to detect objects in an environment in which the system is being operated. Not only can the mixed-reality system 100 use the spatial input devices to detect the objects, the mixed-reality system 100 can also use the spatial input devices in an attempt to identify what those objects actually are.

For instance, suppose the user 200 from FIG. 2 was using the mixed-reality system 100 in a living room. Most living rooms have a variety of objects included therein (e.g., couches, tables, lamps, etc.). Using its spatial input devices, the mixed-reality system 100 detects and identifies those living room objects. Even further, the mixed-reality system 100 can use those objects to develop and present a mixed-reality scenario to the user 200 (e.g., the mixed-reality system 100 can show the couch as being on fire, or a villain breaking through a wall).

As suggested above, the on-body devices (e.g., the handheld controller 220 from FIG. 2) can also include these spatial input devices. As a result, the HMD 210 and the various on-body devices can be used to understand the environment and to create a working model of that environment. Once this model is created, the mixed-reality system 100 tracks the objects and uses the environment to create a better mixed-reality scenario. As indicated before, a depth sensor can be used to understand depth of objects in the environment and can facilitate in the process of identifying what those objects are. Accordingly, using its spatial input devices, a mixed-reality system 100 can generate a working model of an environment and use that model to enhance any mixed-reality scenarios.

While the above discussion focused on the use of on-body devices (e.g., the HMD 210 and handheld device 220) to transmit and receive the magnetic field signal, different embodiments of the present invention can utilize other spatial input devices to transmit and receive the magnetic field signal. Indeed, some situations may desire greater flexibility in determining which spatial input devices are used to transmit or receive the magnetic field signal. For instance, instead of an on-body device or the HMD 210 transmitting the magnetic field signal, a tablet or other computing system may be used to transmit the signal.

For example, a user within a mixed-reality environment may be using a drafting program to design an engine. At different portions of the design process, it may be beneficial to seamlessly switch from interacting with a three-dimensional model within the mixed-reality environment to working on the computer in a two-dimensional model. In at least one embodiment, a handheld controller 220 transmits magnetic field signals to an HMD 210 while the user is working on the three-dimensional model. The handheld controller 220 then automatically begins to receive magnetic field signals generated by the computer when the user is working on the two-dimensional model. As such, the user can utilize the same handheld controller 220 to interact with both the three-dimensional model via the HMD 210 and the two-dimensional model on the computer.

In at least one embodiment, the mixed-reality system 100 optimizes the quality of a received magnetic field signal by adjusting the transmit power of the magnetic field signal based on the distance between two magnetic sensor devices (e.g., a handheld controller 220 and the HMD 210). By dynamically controlling the transmit power of the magnetic field signal, the mixed-reality computing system 100 can optimize the power required to generate an acceptable magnetic field signal that allows for an accurate pose calculation of the handheld device 220 with respect to the HMD 210.

In at least one embodiment, maintaining a constant strength transmission signal has a number of problems associated with it. For instance, when a receiver (e.g., HMD 210) is placed too close to the transmitter (e.g., handheld controller 220), the received signal may become saturated and result in unwanted distortion. This distortion could prevent the mixed-reality system 100 from calculating an accurate pose of either spatial input device. In contrast, when the receiver is too far from the transmitter, the received signal might be too weak to provide accurate data and can also result in inaccurate pose calculation. The received signal could be weak due to the noise ratio in the signal being too high and/or performance limitations in the receiver circuitry.

To avoid the problems discussed above (e.g., saturation of the signal, poor signal to noise ratio, transmission exposure limitations, etc.), the mixed-reality system 100 dynamically controls the magnetic field signal's transmission power. Controlling this power will be influenced by a number of different factors. By way of example and not limitation, the following factors may be considered in determining how to adjust and control the transmission signal: the measurement of the received signal, the measurement of the signal to noise ratio of the received signal, the measurement of other transmitters (which can then be compared with the current measurement), and data collected from other sensors (e.g., data collected from the cameras, depth sensors, infrared sensors, IMU sensors, etc.).

Figure 5A:
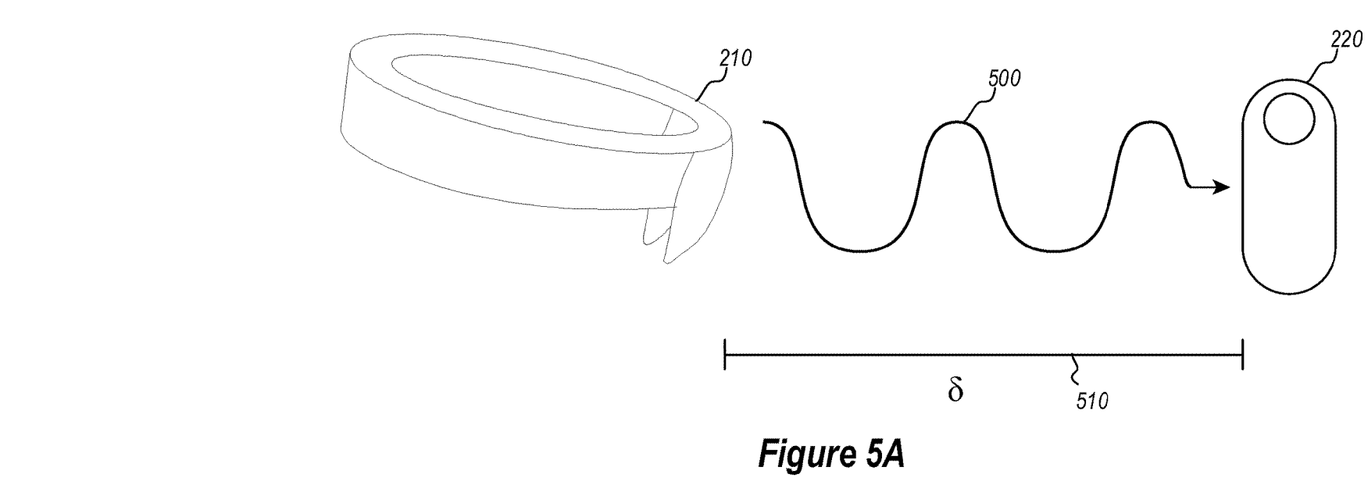
FIG. 5A illustrates an embodiment of spatial input devices communicating within a mixed-reality environment.
Figure 5B:
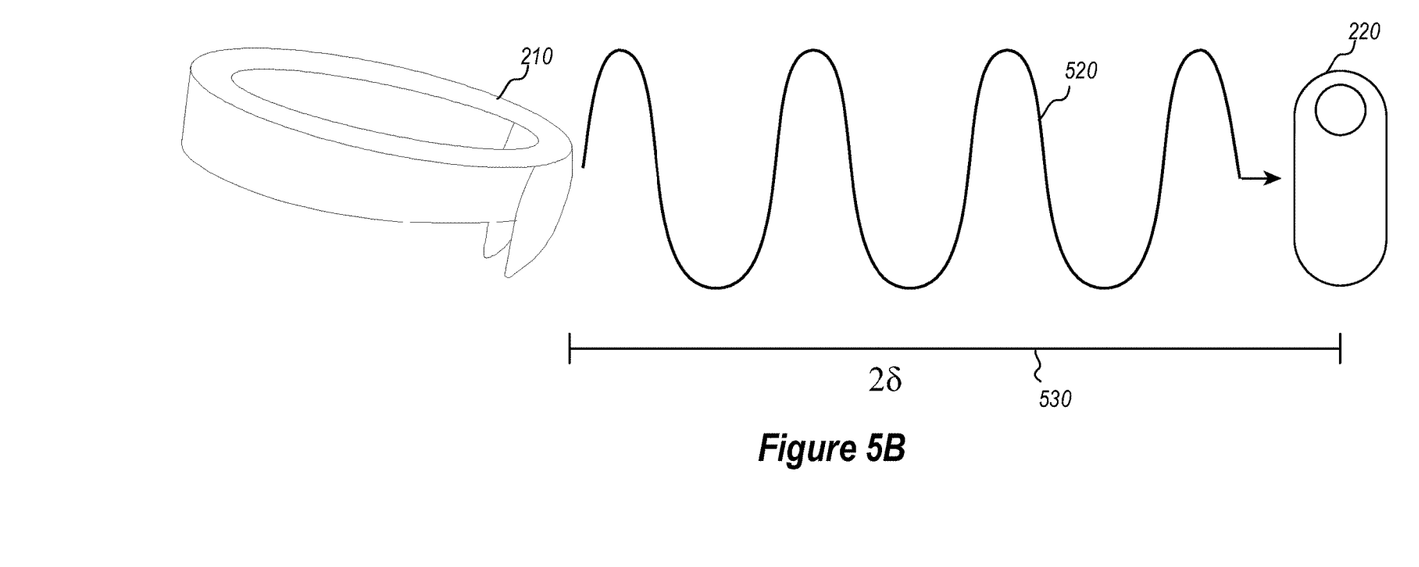
FIG. 5B illustrates another embodiment of spatial input devices communicating within a mixed-reality environment.

FIGS. 5A and 5B illustrates different embodiments of spatial input devices communicating within a mixed-reality environment. In particular, both figures depict an HMD 210 transmitting magnetic field signals 500, 520 to a handheld controller 220. The magnetic field signals 500, 520 comprise different transmission strengths. The particular transmission strengths are determined using methods described herein.

Turning to FIG. 5A specifically, in at least one embodiment, the mixed-reality system 100 (shown in FIG. 1) determines the transmission strength of the magnetic field signal 500. The magnetic field signal 500 is being transmitted from a first magnetic-sensor device within the HMD 210 to a second magnetic-sensor device within the handheld controller 220. The transmission strength may be determined by the handheld controller 220 and then communicated to the one or more processor(s) 120 in the mixed-reality system 100, or the mixed-reality system 100 may receive raw readings from the handheld controller 220, which the mixed-reality system 100 translates into a transmission strength.

In at least one embodiment, the mixed-reality system also determines a first projected distance 520
between the HMD 210 and the handheld controller 220. The projected distance 510 in FIG. 5A is depicted as comprising a length of δ. The mixed-reality system may calculate the projected distance 510 using the strength of the received magnetic field signal. In particular, the mixed-reality system may calculate the projected distance 500 based upon the amount of signal fall-off between the known transmission strength and the measured receive strength.

In alternative or additional embodiments, the mixed-reality system 100 utilizes data from other sensors to determine the projected distance 510 between the HMD 210 and the handheld controller 220. For example, the mixed-reality system may receive image data from a camera that is useable to determine the projected distance 510. Similarly, the mixed-reality system 100 may receive data from an IMU indicating a rate and direction at which the HMD 210 and the handheld controller 220 are being moved. The mixed-reality system 100 then calculates the projected distance 510 using this data. One will appreciate that these specific sensors are provided only for the sake of example and clarity and that there are several other sensors that can be used to measure relative distance between the HMD 210 and the handheld controller 220.

Once the mixed-reality system 100 has determined a projected distance 500, the mixed-reality system 100 calculates an adjusted transmission strength for the magnetic field signal based at least in part on the projected distance 510. For example, the projected distance in FIG. 5A is represented by a length of δ. In contrast, the projected distance 530 in FIG. 5B is represented by a length of 2δ, or twice the length of projected distance 500. Based upon the increase in distance between projected distance 500 and projected distance 530, the mixed-reality system calculates an adjusted transmission strength that comprises an increase in transmission power. The increased power should increase the signal's ability to coherently travel the longer projected distance 530.

The mixed-reality system 100 then causes the first magnetic-sensor device within the HMD 210 to transmit an adjusted magnetic field signal 520 that comprises the adjusted transmission strength. For example, FIG. 5B depicts the first magnetic-sensor device within the HMD 210 transmitting the adjusted magnetic field signal 520 to the handheld controller 220. The mixed-reality system 100 receives, from the second magnetic-field device, the adjusted magnetic field signal 520. Based at least in part upon the received adjusted magnetic field signal 520, the mixed-reality system 100 computes a pose of the first magnetic-sensor device in relation to the second magnetic-sensor device.

Accordingly, in at least one embodiment, the mixed-reality system 100 optimizes the magnetic field signal 500, 520 by increasing the transmission strength as distance increases and decreasing the transmission strength as distance decreases. The ability to dynamically adjust the signal transmission strength in this way increases battery life by transmitting at lower power levels when possible. Additionally, the ability to dynamically adjust the transmission strength of the magnetic field signals helps avoid saturating magnetic-sensor devices.

In addition to optimizing the transmission strength based upon projected distance, in at least one embodiment, the mixed-reality system 100 also dynamically adjusts the signal transmission strength based upon noise within the magnetic spectrum. For example, the mixed-reality system 100 identifies magnetic noise received by the second magnetic-sensor device within the handheld controller 220. Based at least in part on the magnetic noise, the mixed-reality system 100 calculates the adjusted transmission strength 520 for the magnetic field signal. For instance, the mixed-reality system 100 increases the signal transmission strength to overcome a high noise threshold. In contrast, the mixed-reality system 100 decreases the signal transmission strength in a low noise environment, in order to preserve battery life.

In at least one embodiment, after collecting data from the various spatial input device (e.g., HMD 201 and handheld controller 220), the mixed-reality system 100 evaluates and weighs the data against the past history of the spatial input devices and/or the transmission strength. For example, based upon a calculated first pose, the mixed-reality system 100 calculates a predicted second pose of the first magnetic-sensor device within the HMD 210 in relation to the second magnetic-sensor device within the handheld controller 220. The second pose might be predicted based upon historical poses that follow a pose similar to the first pose. For instance, the first pose may comprise an indication that the handheld device 220 is being held over a user's shoulder as if the user is preparing to throw. The mixed-reality system 100 may then predict that the second pose will be along the standard motion path of a throw.

Based at least in part on the predicted second pose, the mixed-reality system 100 calculates the adjusted transmission strength for the magnetic field signal. For example, the second pose along the standard motion path of a throw may indicate that the distance between the first magnetic-sensor device within the HMD 210 and the second magnetic-sensor device within the handheld controller 220 is increasing. Accordingly, the mixed-reality system 100 calculates the adjusted transmission strength such that the strength increases.

Similarly, in at least one embodiment, the mixed-reality system 100 receives an indication of motion from a spatial input device 170 (shown in FIG. 1), such as an IMU, that is associated with the first magnetic-sensor device. For example, both the first magnetic-sensor device and the IMU may be disposed within the HMD 210. As such, when the HMD 210 moves the IMU detects the movements through the use of accelerometers and gyroscopes. Based upon the indication of motion, the mixed-reality system 100 calculates a second projected distance 530 between the first magnetic-sensor device within the HMD 210 and the second magnetic-sensor device within the handheld controller 220. For example, the mixed-reality system 100 may calculate, based upon the velocity and acceleration provided by the IMU, the distance that the handheld controller 220 has travelled. Based at least in part on the second projected distance 530, the mixed-reality system 100 calculates the adjusted transmission strength for the magnetic field signal.

As suggested, the history of the signal's transmission can be preserved for later use. This historical data can be used to predict where the magnetic sensor device will next be located. Further, the use of this data will help in the development of an appropriate power control level. For example, if the distance between two magnetic sensor devices is increasing over time, the prediction components of the mixed-reality system 100 increase the transmission strength to maintain an appropriate signal-to-noise ratio. In contrast, if the distance between the two magnetic sensor devices is decreasing, the mixed-reality system 100 decreases the transmission strength.

Adjusting the transmission strength can be accomplished in a variety of ways. By way of example and not limitation, the transmission strength can be organized as discrete steps. In at least one embodiment, when adjusting the transmission strength, the mixed-reality system 100 causes the transmission strength to traverse through a predetermined discrete set of levels. In other words, the transmission strength can step up levels (i.e. perpetually increase by a discrete amount) until an appropriate power level is reached.

The mixed-reality system 100 can also be optimized by reducing the number of oscillations between discrete power levels. Oscillations between discrete power levels entails the repeated back and forth, or switching, between power levels when faced with a boundary condition. To accomplish this reduction in oscillations, the mixed-reality system 100 allows hysteresis to be introduced. The introduction of hysteresis allows the mixed-reality computing system 100 to avoid numerous power switching when faced with the above-mentioned boundary condition (e.g., due to the step-like levels, the system may repeatedly bounce back and forth between power levels).

Additionally, in at least one embodiment, the mixed-reality system 100 also calculates an adjustment rate at which the transmission strength of the magnetic field is adjusted. For example, if the IMU indicates that the handheld controller 220 is being quickly moved away from the HMD 210, the mixed-reality system 100 may increase the rate at which the transmission strength is increased. In contrast, if the IMU indicates that the handheld controller 220 is being slowly moved away from the HMD 210, the mixed-reality system 100 may decrease the rate at which the transmission strength is increased.

The mixed-reality system 100 is also capable of adjusting a transmission strength based upon the software application that the user is interacting with. For example, the mixed-reality system 100 may receive a request for a particular input characteristic from a mixed-reality software application that is receiving input from the first magnetic-sensor device. The particular input characteristic may comprise information relating to a requested input precision. For instance, a user may be interacting with a mixed-reality surgery simulator. At various points during the surgery simulation, it may be desired that the spatial input devices exhibit an extremely high sensitivity to the user's movements. The mixed-reality surgery simulator communicates this input request to the mixed-reality system 100. Based at least in part on the requested particular input characteristic, the mixed-reality system calculates the adjusted transmission strength for the magnetic field signal. For example, the mixed-reality system 100 may significantly increase the transmission strength between the HMD 210 and the handheld controller 220.

In some embodiments, the process of switching transmission strength is not an instant process. For instance, when a magnetic sensor device transitions from one power level to another, it is possible that the resulting pose data could be corrupted by certain transients that are generated during the switch. In at least one embodiment, to mitigate these transients, the mixed-reality system 100 utilizes data from other spatial input devices during a transition phase. By using other data, less reliance is placed on the magnetic field signal which results in the preservation of the pose calculation.

In at least one embodiment, the mixed-reality system 100 characterizes the dynamics of transition phases during calibration and applies this information to magnetic field signals received during the transition. For example, during a time when the components undergo calibration, the mixed-reality system 100 collects and analyzes magnetic field signal data that was collected when a switch in power levels occurred. Using this test data, the mixed-reality system 100 can later correct actual received signal data based on the results and analysis of the prior test data.

Additionally, in at least one embodiment, during a transition phase from a first transmission strength to a second transmission strength, the mixed-reality system 100 receives from the first magnetic-sensor device a set of transmission strengths being emitted by the first magnetic-sensor device. For example, during the transition itself, the magnetic sensor device within the HMD 210 communicates signal strength data to the mixed-reality system. This signal strength data may comprise the transients that would otherwise disrupt sensor readings. However, because the mixed-reality system 100 has the signal strength data from the HMD 210, the mixed-reality system 100 is able to filter out the transients and accurately determine a pose.

Now, an exemplary method that enables a mixed-reality system 100 to dynamically adjust a transmission power to optimize a signal received by a receiver will be described with respect to FIG. 6.

Figure 6:
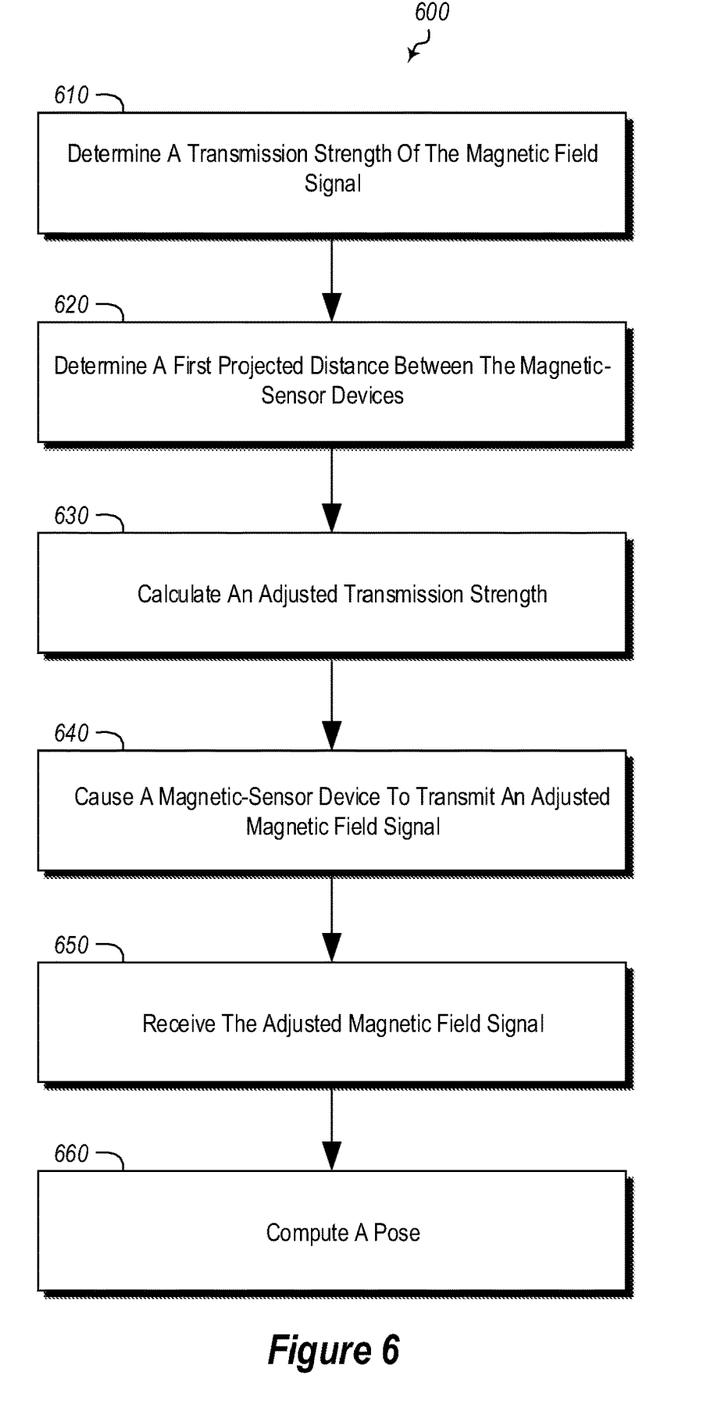
FIG. 6 illustrates steps in an exemplary method that can be followed to dynamically modify a transmission strength of a magnetic field signal.

FIG. 6 presents a method that can be implemented by one or more processors of a computing system. When performed, this method dynamically modifies the transmission strength of a magnetic field signal in an effort to optimize that signal at a receiver. To that end, the method includes an act (act 610) in which the transmission strength of the magnetic field signal is determined. This signal is being transmitted between a first magnetic-sensor device (e.g., a handheld device 220) and a second magnetic-sensor device (e.g., the HMD 210).

The method also includes an act (act 620) in which a projected distance between the first magnetic-sensor and the second-sensor device is determined. As suggest earlier, this projected distance can be determined in a variety of ways (e.g., historical data, sensor data, etc.).

Based on this projected distance, an adjustment to the transmission signal strength is calculated (act 630). This adjustment will optimize the received signal to provide accurate data when calculating the on-body device's pose.

Additionally, the method will cause the first magnetic-sensor device to transmit an adjusted magnetic field signal (act 640). The adjusted magnetic field signal comprises the adjusted transmission strength. The method further includes receiving the adjusted magnetic field signal and computing a pose of the magnetic-sensor devices (acts 650 and 660). Because the magnetic-sensor devices will likely be in constant motion, these acts can be repeatedly performed in an effort to preserve the accuracy of the data used in calculating the device's pose.

Accordingly, described herein are embodiments related to wearable mixed-reality computing systems 100, methods, and computer-readable media that dynamically adjust a magnetic field signal's transmission power to optimize the reading of that signal at a receiver. The system may include various components that are configured to perform the processes outlined above.

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

Computing system functionality can be enhanced by a computing systems' ability to be interconnected to other computing systems via network connections. Network connections may include, but are not limited to, connections via wired or wireless Ethernet, cellular connections, or even computer to computer connections through serial, parallel, USB, or other connections. The connections allow a computing system to access services at other computing systems and to quickly and efficiently receive application data from other computing systems.

Interconnection of computing systems has facilitated distributed computing systems, such as the so-called "cloud" computing systems. In this description, "cloud computing" may be systems or resources for enabling ubiquitous, convenient, on-demand network access to a shared pool of configurable computing resources (e.g., networks, servers, storage, applications, services, etc.) that can be provisioned and released with reduced management effort or service provider interaction. A cloud model can be composed of various characteristics (e.g., on-demand self-service, broad network access, resource pooling, rapid elasticity, measured service, etc.), service models (e.g., Software as a Service ("SaaS"), Platform as a Service ("PaaS"), Infrastructure as a Service ("IaaS"), and deployment models (e.g., private cloud, community cloud, public cloud, hybrid cloud, etc.).

Cloud and remote based service applications are prevalent. Such applications are hosted on public and private remote systems such as clouds and usually offer a set of web based services for communicating back and forth with clients.

Many computers are intended to be used by direct user interaction with the computer. As such, computers have input hardware and software user interfaces to facilitate user interaction. For example, a modern general purpose computer may include a keyboard, mouse, touchpad, camera, etc. for allowing a user to input data into the computer. In addition, various software user interfaces may be available.

Examples of software user interfaces include graphical user interfaces, text command line based user interface, function key or hot key user interfaces, and the like.

Disclosed embodiments may comprise or utilize a special purpose or general-purpose computer including computer hardware, as discussed in greater detail below. Disclosed embodiments also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry program code in the form of computer-executable instructions or data structures and which can be accessed by a general purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A head-mounted device (HMD) comprising:
a wearable display;
a magnetic field transceiver;
a processor; and
a computer-readable hardware storage device having stored thereon computer-executable instructions that are executable by the processor to cause the HMD to perform at least the following:
cause the magnetic field transceiver to transmit a magnetic field signal to a remote magnetic field transceiver;
receive, from the remote magnetic field transceiver, a response to the magnetic field signal; and
based on the received response, compute a pose of the remote magnetic field transceiver with respect to the HMD.

2. The HMD of claim 1, wherein execution of the computer-executable instructions further causes the HMD to:
identify magnetic noise associated with the transmitted magnetic field signal; and
based at least in part on the magnetic noise, calculate a transmission strength for the magnetic field signal.

3. The HMD of claim 1, wherein execution of the computer-executable instructions further causes the HMD to:
based on the pose, calculate a predicted second pose of the remote magnetic field transceiver; and
based on the predicted second pose, calculate an adjusted transmission strength for the magnetic field signal.

4. The HMD of claim 1, wherein execution of the computer-executable instructions further causes the HMD to:
identify a movement of the HMD;

based on the movement of the HMD, calculate a projected distance between the HMD and the remote magnetic field transceiver; and based on the projected distance, calculate a transmission strength for the magnetic field signal.

5. The HMD of claim 4, wherein execution of the computer-executable instructions further causes the HMD to:

based on continued movement of the HMD, calculate an adjustment rate at which the transmission strength of the magnetic field is adjusted in response to the continued movement of the HMD.

6. The HMD of claim 4, wherein the HMD includes an inertial measurement unit (IMU), and wherein the HMD identifies the movement using data generated by the IMU.

7. The HMD of claim 1, wherein the pose of the remote magnetic field transceiver is determined based on a near field fall off relationship of the magnetic field signal.

8. The HMD of claim 1, wherein the remote magnetic field transceiver is disposed in a handheld controller.

9. The HMD of claim 1, wherein the pose of the remote magnetic field transceiver is determined based on a measured characteristic of the magnetic field signal.

10. The HMD of claim 1, wherein execution of the computer-executable instructions further causes the HMD to:

during a transition phase from a first transmission strength to a second transmission strength, receive, from the remote magnetic field transceiver, a set of transmission strengths being emitted by the magnetic field transceiver of the HMD; and based on the set of transmission strengths, compute the pose.

11. A method for enabling a head-mounted device to determine a pose of a remote magnetic field transceiver via use of one or more determined characteristic(s) of a magnetic field signal that is transmitted between the HMD and the remote magnetic field transceiver, said method comprising:

causing a magnetic field transceiver of a head-mounted device (HMD) to transmit a magnetic field signal to a remote magnetic field transceiver;

receiving, from the remote magnetic field transceiver, a response to the magnetic field signal; and based on the received response, computing a pose of the remote magnetic field transceiver with respect to the HMD.

12. The method of claim 11, further comprising:
identifying magnetic noise associated with the transmitted magnetic field signal; and based on the magnetic noise, calculating a transmission strength for the magnetic field signal.

13. The method of claim 11, further comprising:
based on the pose, calculating a predicted second pose of the remote magnetic field transceiver; and based on the predicted second pose, calculating an adjusted transmission strength for the magnetic field signal.

14. The method of claim 11, further comprising:
identifying a movement of the HMD;
based on the identified movement, calculating a projected distance between the HMD and the remote magnetic field transceiver.

15. The method of claim 14, further comprising:
calculating a transmission strength of the magnetic field.

16. The method of claim 14, wherein the HMD comprises a first inertial measurement unit (IMU) and the remote magnetic field transceiver comprises a second IMU.

17. The method of claim 11, wherein the pose of the remote magnetic field transceiver is determined based on a combination of camera image data and the received response.

18. The method of claim 11, wherein the remote magnetic field transceiver is disposed within a handheld controller.

19. The method of claim 11, wherein the pose of the remote magnetic field transceiver is determined based on (i) camera image data, (ii) a measured characteristic of the magnetic field signal, and (iii) a near field fall off relationship of the magnetic field signal.

20. A computer system comprising:
a magnetic field transceiver;
a processor; and
a computer-readable hardware storage device having stored thereon computer-executable instructions that are executable by the processor to cause the computer system to:

cause the magnetic field transceiver to transmit a magnetic field signal to a remote magnetic field transceiver;

receive, from the remote magnetic field transceiver, a response to the magnetic field signal; and based on the received response, compute a pose of the remote magnetic field transceiver with respect to the computer system.

\* \* \* \* \*